Figure 1:
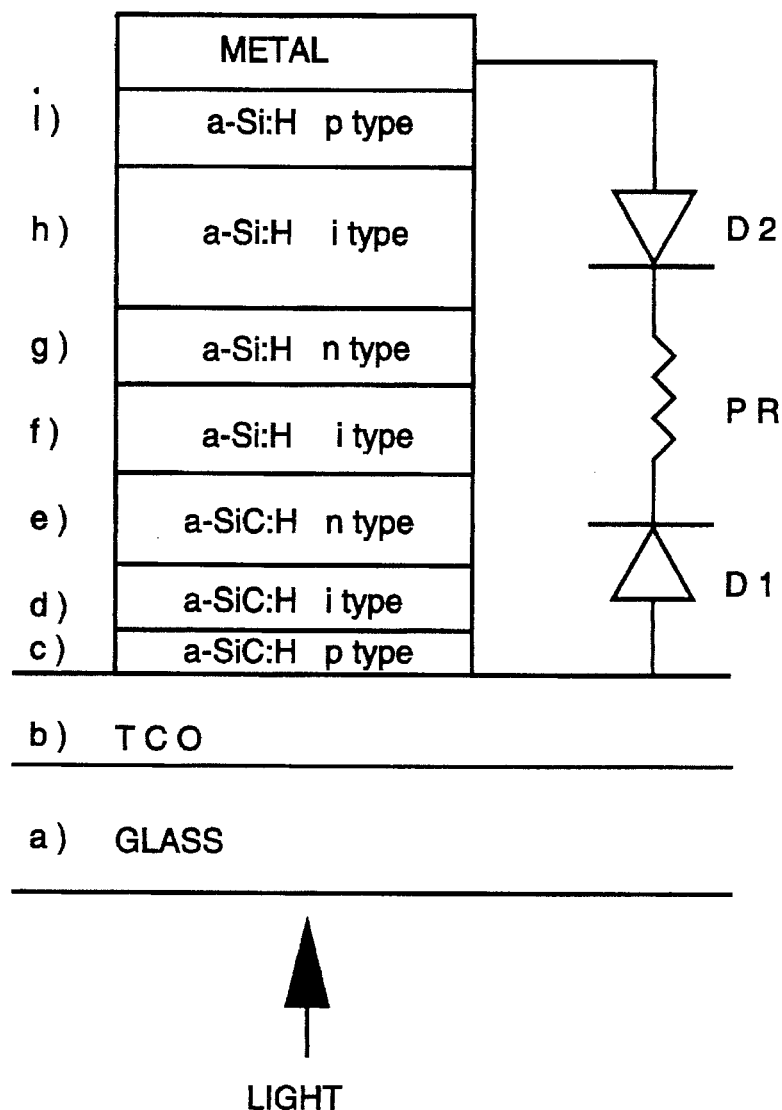

United States Patent [19]
de Cesare et al.

[11] Patent Number: 5,557,133
[45] Date of Patent: Sep. 17, 1996

[54] VOLTAGE-CONTROLLED VARIABLE SPECTRUM PHOTODETECTOR FOR 2D COLOR IMAGE DETECTION AND RECONSTRUCTION APPLICATIONS

[75] Inventors: Giampiero de Cesare; Fernanda Irrera; Fabrizio Palma, all of Rome, Italy

[73] Assignee: Universita Degli Studi Di Roma "La Sapienza", Rome, Italy

[21] Appl. No.: 437,498

[22] Filed: May 9, 1995

[30] Foreign Application Priority Data

May 12, 1994 [IT] Italy .................. RM94A0294

[51] Int. Cl.$^6$ .................. H01L 31/00; H01L 31/075; H01L 31/105; H01L 31/117
[52] U.S. Cl. .................. 257/440; 257/458; 257/53
[58] Field of Search .................. 257/440, 458, 257/53

[56] References Cited

U.S. PATENT DOCUMENTS

| | | | |
|---|---|---|---|
| 4,776,894 | 10/1988 | Watanabe et al. | 257/458 |
| 4,799,968 | 1/1989 | Watanabe et al. | 257/53 |
| 4,820,915 | 4/1989 | Hamakawa et al. | |
| 5,311,047 | 5/1994 | Chang. | |

FOREIGN PATENT DOCUMENTS

| | | |
|---|---|---|
| 0307484 | 3/1989 | European Pat. Off. . |
| 2228826 | 9/1990 | United Kingdom . |

OTHER PUBLICATIONS

Applied Physics Letters, vol. 52, No. 4, 25 Jan. 1988, New York, NY, USA, pp. 275–277, Hsiung–Kuang Tsai et al; "Amorphous SIC/SI Three–Color Detector".

*Primary Examiner*—Stephen Meier
*Attorney, Agent, or Firm*—Herbert Dubno

[57] ABSTRACT

Variable spectrum photodetector allowing the detection of the three main colors of the visible spectrum (red, green and blue) by varying the bias voltage by a few volts around zero. It is built using known thin-film technology and is externally connected by means of two electrical terminals, thus rendering the realization of integrated 2D matrices extremely easy. It is especially applied to the manufacture of TV cameras, fax machines, etc. and of all systems requiring images reconstruction, its structure consisting of a specific overlaying of thin films, preferably of hydrogenated amorphous silicon (a-Si:H) and of its silicon-carbon alloys (a-SiC:H) and silicon-germanium (a-SiGe:H) placed by "Glow Discharge" technique. The invention can be applied to big dimensions structures. Advantages essentially are electrical simplicity and, consequently, it has more maintainability.

7 Claims, 4 Drawing Sheets

READING OF BLUE
AND GREEN LIGHT

READING OF RED
LIGHT

VOLTAGE-CONTROLLED VARIABLE SPECTRUM PHOTODETECTOR FOR 2D COLOR IMAGE DETECTION AND RECONSTRUCTION APPLICATIONS

FIELD OF THE INVENTION

This invention concerns a variable spectrum photodetector allowing the independent detection of three portions of the visible spectrum centered on the three main colours (red, green and blue) by varying the bias voltage in a few volts around zero. This photodetector realized by the known thin-film technologies is externally connected by means of only two electrical terminals, thus making the realization of integrated 2 D matrices extremely easy. The deposition temperature of the material used for the device is such as to allow the use of whatever glass, plastic or metal substrate.

This invention concerns the field of image detection and may be especially applied to the manufacture of TV cameras, fax machines, etc. and of all systems requiring chromatic image reconstruction sensitivity.

The purpose of the invention concerning which patent coverage is being applied for is to solve the problem concerning the reconstruction of large area high resolution colour images.

The real strong point of the invention lies in the possibility of efficiently discriminating limited portions of the visible spectrum corresponding to the three main colours using only two electric terminals. The device works as a photo-current generator the operating threshold of which is at different voltages levels according to the light's wavelength.

PRIOR ART

The recognition of red and blue was not particularly difficult, and has been obtained in various ways, while the recognition of the intermediate spectrum (green) by the same detector has been extensively researched with various technological solutions but with scarce results.

SUMMARY OF THE INVENTION

In this invention, the recognition of the three colours is made possible by the three devices stacked in the structure: diode n-i-n, back-diode. The electrical features of the series vary according to the intensity and wavelength of the incident light.

Figure 4:
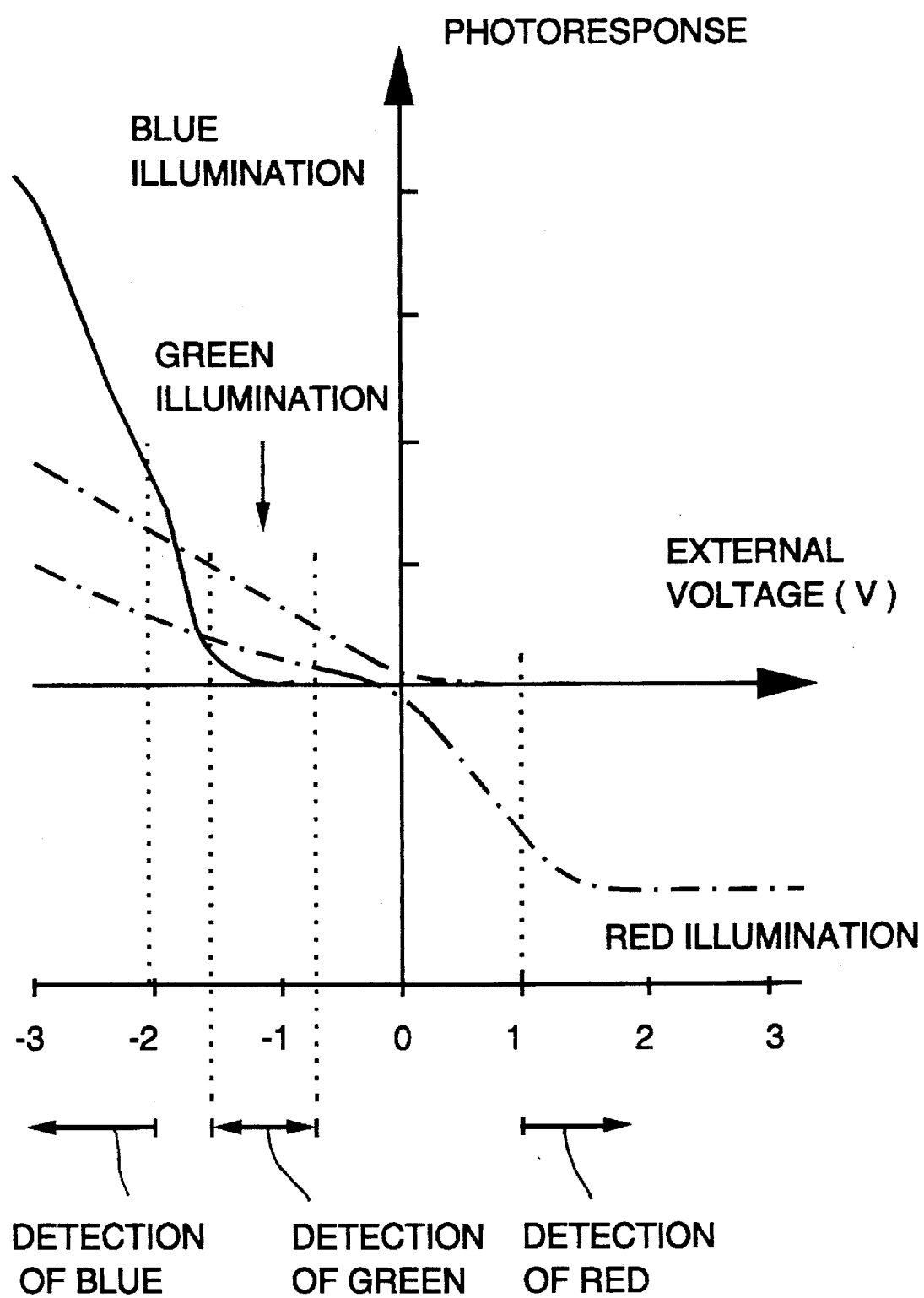

Compared to previous solutions described in scientific literature, the presence of the photoresistor ensures an effective spearation between spectral windows and, in particular, between the green window and the two lateral ones, since within the interval of voltages in which green is recognized, the other two colours cannot be detected. (FIG. 4).

It is a well known fact that the complete characterization of a colour is achieved by mixing three chromatic coordinates, which in turn consist of complex spectra, approximately centered in the red, in the blue and in the green.

Visible frequency light detectors already exist on the market and are applied to electronic image reconstruction systems (TV cameras, colour fax machines, etc.) They consist of matrices integrated by silicon optical detectors, each one made selective to a different optical frequency interval by using coloured filters which attempt to reproduce the ideal colours. Therefore, the three main frequencies of the visible spectrum are detected by three distinct detectors (for a total of 2×3=6 electrical terminals) integrated into a single pixel and treated with three passband optical filters centered on the red, green and blue frequencies.

In this invention, the manufacturing of the photodetector for the 3 main colours of the visible spectrum requires the optimization of the thicknesses and of the absorption coefficients of various layers, so as to select the absorption of blue, red and green. The optimization of the layers' thickness is made possible by controlling the deposition parameters, while the absorption coefficients depend on fundamental properties of the materials used, such as the value of the semiconductor's forbidden gap and the density of the states in the gap. The invention's description gives greater weight to the gap modulation of the gap extension, obtained with silicon-carbon and silicon-germanium alloys.

Evidently the values of the different thicknesses and gaps lead to the selection of other spectral windows. In fact, it has been demonstrated that by using microcrystal materials obtained using the same high hydrogen dilution "Glow Discharge" technique, photodetection can be pushed into near IR while, if the diode is particularly thin and with a high gap, absorption shifts into the violet region.

In conclusion, in the structure described in this application for patent, the three windows are easily tunable into a spectral region which can extend from violet to IR, using alloys of silicon with carbon or germanium. Finally, if the light does not impinge through the glass substrate but on the side of the other electrode —for example, through a grid in the metal—the window with short wavelengths can be pushed into the ultraviolet. cl Advantages In view of the above, it ensues that the advantages offered by this invention when compared to already existing solutions are the following:

reading of the three distinct spectra, for example centered on red, green, blue;

large area realization;

low production costs;

electrical simplicity (only two terminals);

possibility of creating portable and extremely compact and lightweight colour image detection units (TV cameras, photocopiers, fax machines).

As already mentioned above, coloured light detectors are already available on the market and prevailingly apply two different techniques, both based on the use of silicon detectors.

Figure 5:
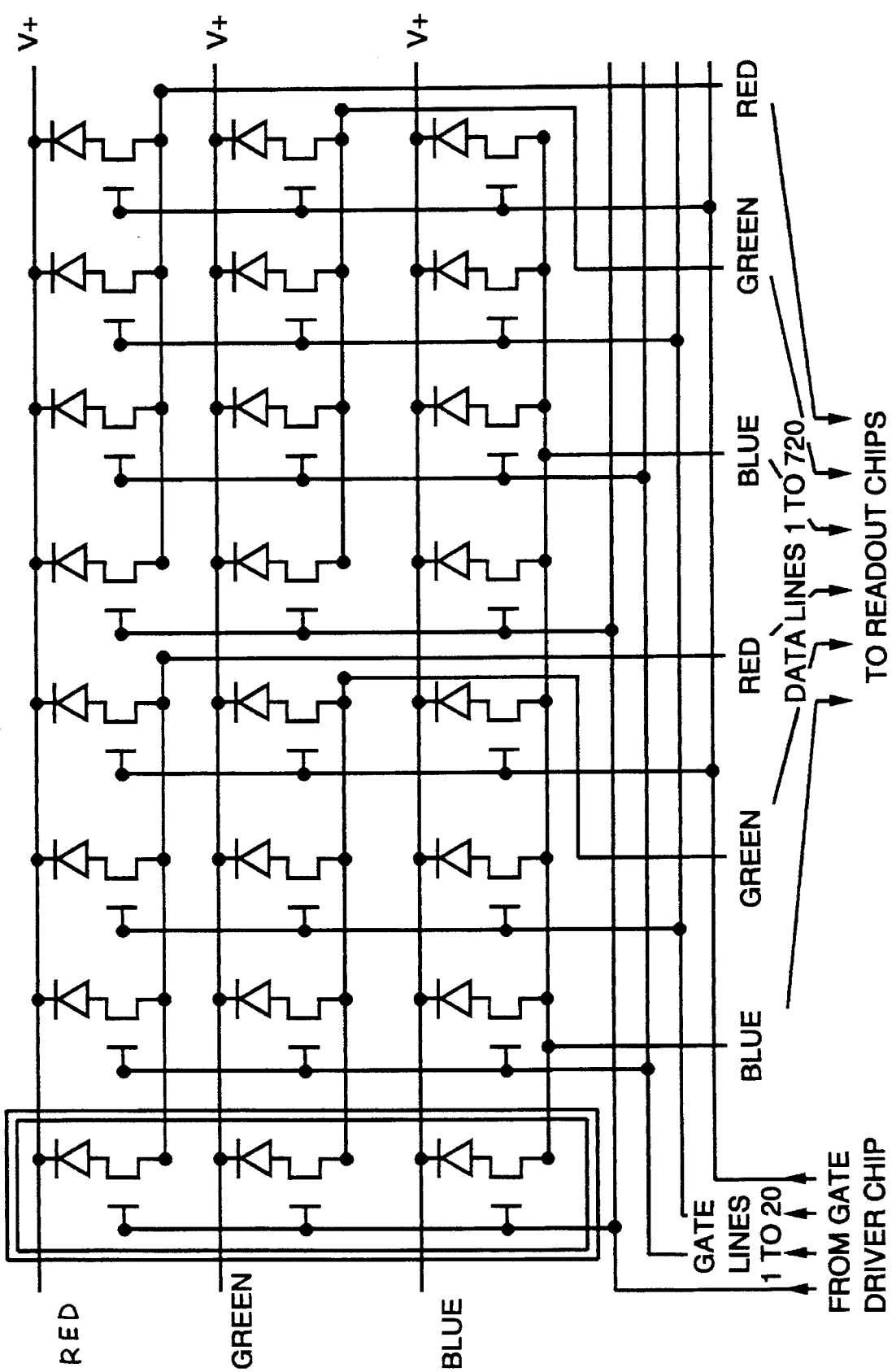

In the first technique, detection of the coloured image derives from the integration, for each pixel of the matrix, of the signals coming from three distinct detectors each one illuminated through an optical filter centered around the three main frequencies. FIG. 5 (Richard L. Weisfield, "Proceedings of Amorphous Silicon Technology", Vol 258, 1992) describes an example of application of this technique. Obviously, the area occupied by a complete pixel is necessarily greater than that occupied by three individual detectors, with loss of the maximum definition possible in the image's final reproduction.

Less common is the second technique, in which the pixel is composed of a single detector, which is illuminated in three consecutive instants by the light filtered through the usual three monochromatic filters. Colour reconstruction occurs after reading the detector's three responses.

The solution proposed herein does not require monochromatic optical filters, therefore considerably simplifying the structure's realization. The possibility of having colour detection using a single detector increases the image's definition with respect to the first technique described above, while the absence of mechanical components allows for considerably lower reading times of the entire matrix with respect to those necessary in the second technique described above, therefore making it easy to create portable units.

DRAWINGS

This invention will now be described on the basis of a version preferred by the Inventors and with reference to the following attached figures:

FIG. 1 - Physical structure of the invention with the equivalent circuit of the entire device.

Figure 2:
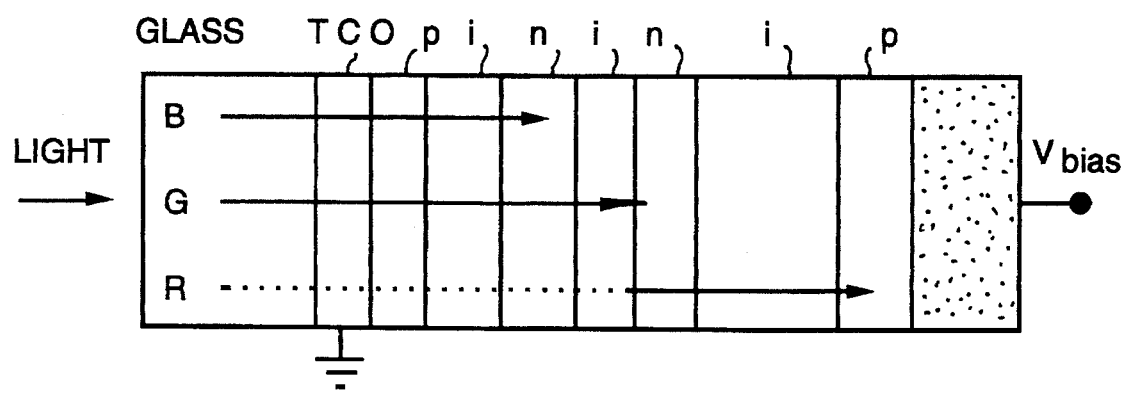

FIG. 2 - Optical absorption pattern for the three pure colours of the visible spectrum.

Figure 3:
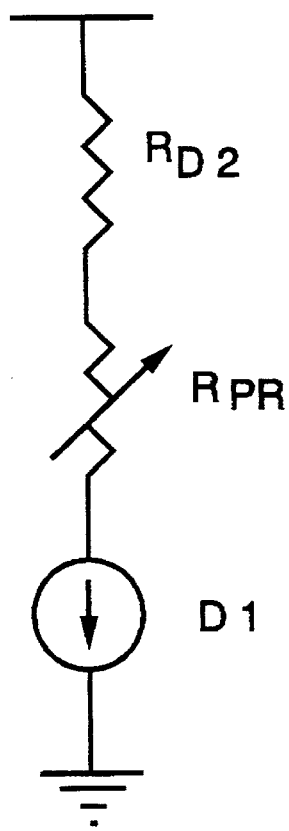
Figure 3:
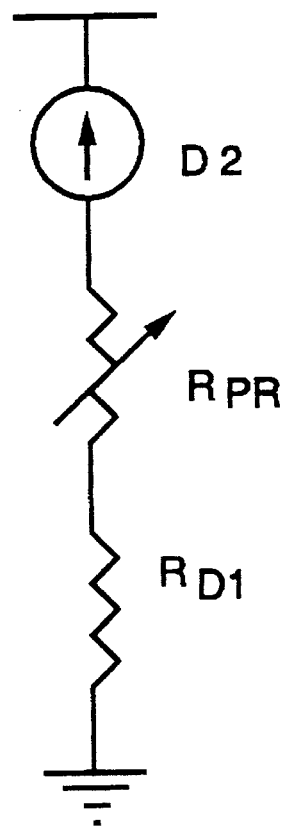

FIGS. 3a & 3b - Equivalent circuit of the device under illumination during reading (for blue and green light see 3a, for red see 3b).

FIG. 4 - Schematic illustration of the current photogenerated by the device in function of the bias voltage applied in the three illumination conditions filtered with red, blue and green filters.

FIG. 5 - Example of the known application of the manufacturing technique for photo-sensitive matrices using passband red, blue and green filters for colour detection.

EMBODIMENT OF THE INVENTION

As regards FIG. 1, bear in mind that the real dimensions of the layers are qualitatively discussed in the patent's text. In the drawing, the ratios between the dimensions of the various thicknesses are kept small for pictorial purposes.

As regards FIGS. 3a & 3b, the structure may be compared to the series of 3 circuit components: two back-to-back diodes D1 and D2 and an n-i-n structure which can be regarded as variable photoresistance (PR).

The behaviour of the n-in-n non linear but at values of the applied bias as those of interest for the present device it can be linearized.

In function of the external bias voltage applied, one or the other of the two diodes is reverse biased and acts as a current generator: in the case of −3 Vbias, it is the rear diode which feeds current, and therefore only red light can be detected; in the case of +3 Vbias, the blue light is detected because D1 acts as current generator and blue light is much more absorbed in D1 than red or green light. The presence of the n-i-n structure allows to discriminate green light.

As regards FIG. 5, the Inventors have provided in the text an application of the known technique only as compared with the invention presented herein.

In observing FIG. 1, the first semiconductor layer (c) is a doped p-type, while the second layer is an intrinsic layer (d). Both are very thin (5–10 μm) and are made of Silicon-Carbon alloys. These characteristics are necessary in order to maximize absorption of the blue colour in intrinsic (d), as explained further below.

Then there is a third doped n-type a-Si:H layer (e), then one intrinsic a-SiC:H layer (f) and another n-type a-Si:H layer (g). These three layers should be a few dozen nanometers thick. Finally, there is an intrinsic a-Si:H layer much thicker than the rest (h) and then the last p-type a-Si:H layer (i). The intrinsic layer indicated by "h" in the drawing must be very thick and made of hydrogenated amorphous silicon in order to maximize red colour absorption, as described further below. The last layer is a metal deposit in order to ensure a good ohmic contact with the semiconductor.

The structure's operation as light detector is made possible by the following properties:

a) hydrogenated amorphous silicon is a direct gap semiconductor (approx. 1.72 eV). This allows it to have a high absorption coefficient in the entire visible spectrum (approx. from 370 μm to 700 μm). In particular, the lower wavelength light (blue) is strongly absorbed (small penetration depth) while the higher wavelength light (red) is on the contrary weakly and almost uniformly absorbed, with typical penetration depths of even 1 micrometer. Moreover, the absorption of the red light (low energy photons) can be considerably decreased by increasing the forbidden gap of the material, for example by using carbon alloys, or increased by using low gap silicon-germanium alloys.

b) the p-i-n-i-n-i-p structure may be seen as the series of three circuit components: a first p-i-n diode (D1), an n-i-n photoresistance (PR), and a second n-i-p diode (D2, reverse-biased with respect to the first (see FIG. 1). These three components are crossed in succession by the light which arrives after having penetrated the glass and the transparent conductor. On the basis of points 1) and 2), the passage of light can be illustrated as follows: the blue light is absorbed immediately in D1, the green is absorbed in D1 and in Pr, and the red in D1, in PR and in D2.

The optical situation described up to here is illustrated schematically in FIG. 2: arrow B indicates the passage of the blue component, which is strongly absorbed; arrow G indicates the green; and arrow R indicates the red, and is dotted in the a-SiC:H regions where it is very weakly absorbed.

c) Light absorption may occur, naturally, both in the doped layers and in the intrinsic layers. Anyhow, only the intrinsic layers are efficient in terms of collecting photogenerated carriers because they have less defects and in them the carrier's average life is longer.

We therefore associate the generation of electron hole pairs to the photons' absorption in an intrinsic layer. It is obvious that at a fixed photon energy level, the generation of pairs increases with the increase in the intrinsic layer's thickness.

It is a fact that, with reference to FIG. 2, the blue light generates carriers only in D1, the green in D2 and in PR, while the red generates very few carriers in D1 and in PR given the minimal thickness of the two intrinsic layers and their high gap, while it generates many carriers in D2 the intrinsic layer of which is definitely longer and the gap of which is lower.

At this point, let us explain why through the control of the external bias (Vbias) between metal and TCO it is possible to select each time only one of the three main colours. Consider that the extraction of carriers in diode p-i-n, and therefore the passage of current on an external load, is possible only when the diode is reverse-biased.

First of all, let us better define the role of photoresistance (PR): it is a variable resistance, the value of which decreases as the illumination increases. In the case of low light absorption in the PR, the current along the mesh shall generate at the PR's ends a voltage drop ($V_{PR}$) proportional to the logarithm of this current. In this case, at the terminals of the diode which is functioning as generator there shall be a drop: Vd=Vbias−Vpr (ignoring the resistance of the second diode). This implies the limitation to the current generated by the generator, since it exponentially depends from Vd. This alteration is particularly important when the generator is biased just above the operating threshold, because in this case the resulting current is almost zero.

If the PR is illuminated and the light is efficiently absorbed (case of illumination with green light), its resistance is very low, the voltage drop Vpr at its ends is also very low, and the current generated by the generator and collected at the two external terminals is not limited in any way. On the contrary, if the PR is in the dark (case of blue light) or the light is scarcely absorbed (case of red light), its resistance is high, Vpr limits Vd and the current generated is practically equal to zero for low bias voltage levels. In practice, the voltage necessary to detect the blue and red light is shifted towards higher absolute values, leaving a voltage interval in which the current is proportional to the green light absorbed.

Absorption of the green light is equivalent to a shift towards absolute values which are lower than diodes D1's threshold.

It is worth pointing out that the PR's value naturally also depends from the absorbed light's intensity. At the same green optical frequency, the resistance is lower for greater incident intensities. Therefore, the shifting of D1's reverse current threshold occurs beyond a minimum value of the incident green light's intensity.

For simplicity's sake, let us suppose that the TCO is grounded and that we distinguish three cases: i) positive Vbias greater by a few Volts (3–4 V), ii) slightly positive Vbias, iii) negative Vbias with an absolute value greater by a few Volts (3–4 V).

CASE i) Vbias>3 V

Diode D1 is reverse-biased and acts as a photogenerated carriers' current generator, while D2 is directly biased and can be compared to a low resistance (see FIG. 3a). If in the incident light there is blue, the photocurrent generated by D1 is high because in it the generation is high, while the photocurrent due to the incident red light is negligible, since the absorption in D1 is negligible. The direction of the current is indicated in FIG. 3a. In this case, n-i-n is not illuminated and therefore it is a very high resistance. As mentioned before, the photocurrent's voltage threshold shall be shifted. On the other hand, the choice of (relatively) high bias values makes sure that the generator is producing a definitely high current, on which the effect of the n-i-n is absolutely negligible. The recognition of the blue colour is therefore possible at these bias values.

CASE ii) 0.5<Vbias<1.5

This case is more interesting, and solves the fundamental problem of detecting the third colour while maintaining the two-terminal structure. In discussing this case, the main actor is the n-i-n (PR). Since it is serially connected to a low intensity current generator (at 0.5 V, D1 is just above the inversion threshold), it gives rise to a drop in voltage (Vpr) proportional to the resistance value. If PR is illuminated and the light is greatly absorbed (case of green light), its resistance is very low, the Vpr voltage drop at its ends is also very low, and the current generated by D1 and collected at the two external terminals is in no way limited. On the contrary, blue light leaves the R in the dark and red light is scarcely absorbed, so that for these light components its resistance is very high, thus limiting the current generated by D1 to almost zero.

In this bias interval, the circulating current is therefore essentially due to the green light.

CASE iii) Vbias<–3 V

Diode D2 is reverse-biased and acts as a photogenerated carriers' current generator, while D1 is directly biased and can be compared to a low resistance (see FIG. 3b). If in the incident light there is red, the photocurrent generated by D2 is high because in it the generation is high, while the photocurrent due to the incident blue light is zero, since blue doesn't arrive in D2. The direction of the current is indicated in FIG. 3b. In this case, n-i-n is illuminated, but the light is weakly absorbed on a small thickness and therefore it has a rather high resistance. In this case, the photocurrent's voltage threshold shall be slightly shifted. On the other hand, the choice of (relatively) high bias values (lower than –3 V) makes sure that the generator is producing a definitely high current, on which the effect of the n-i-n is absolutely negligible. The recognition of the red colour is therefore possible at these bias values.

In conclusion, there are three distinct intervals of (low) voltages in each of which occurs the selective detection of only one of the three main colours of the visible spectrum: red, green and blue. FIG. 4 shows an example of expected typical curve of the current (Iph) to the Vbias voltage. The absolute value of the generated photocurrent will vary according to the intensity of each of these three components and it shall therefore be possible to attribute a weight coefficient to each colour.

We claim:

1. A voltage-controlled variable spectrum photodetector comprising:

a translucent conductor forming a first electrode;

a first layer of a doped semiconductor of a first conductivity type, a second layer of an intrinsic semiconductor and a third layer of a doped semiconductor of a second conductivity type forming a first junction diode stack on said conductor and transluminatable by light through said translucent conductor;

a fourth layer of an intrinsic semiconductor on said third layer and a fifth layer of a doped semiconductor of said second conductivity type on said fourth layer, said third, fourth and fifth layers together forming a variable photoresistor stack on said first junction diode stack;

a sixth layer of an intrinsic semiconductor on said fifth layer and a seventh layer of a doped semiconductor of said first conductivity type on said sixth layer, said fifth, sixth and seventh layers forming a second junction diode stack poled opposite said first junction diode stack on said variable photoresistor stack; and a further electrode on said second junction diode stack whereby a bias voltage varying by a few volts from zero applied across said electrodes selectively renders the photodetector responsive to three principal colors of the visible spectrum.

2. The photodetector defined in claim 1 wherein said first conductivity is a p conductivity and said second conductivity is a n conductivity and said detector has between said electrodes a p-i-n-i-n-i-p structure.

3. The photodetector defined in claim 1 wherein said first conductivity type is n conductivity, said second conductivity type is p conductivity and said photodetector has between said electrodes a n-i-p-i-p-i-n structure.

4. The photodetector defined in claim 1 wherein all of said layers are composed of hydrogenated silicon, hydrogenated silicon-carbon or a silicon-germanium alloy.

5. The photodetector defined in claim 1 wherein the thicknesses of said layers are so selected that at least one layer absorbs blue light, at least another layer absorbs green light and at least a further layer absorbs red light.

6. The photodetector defined in claim 1 wherein said third layer is of a sufficient thickness to reduce penetration of blue light therethrough and said fifth layer is of sufficient thickness to reduce penetration of green light therethrough.

7. The photodetector defined in claim 1, further comprising a glass substrate formed with a stannous oxide coating forming said translucent conductor, said first through seventh layers being grown in succession on said coating of stannous oxide.

* * * * *